United States Patent
Branner et al.

(10) Patent No.: US 6,259,904 B1
(45) Date of Patent: Jul. 10, 2001

(54) FAST SQUELCH CIRCUIT AND METHOD

(75) Inventors: Donald Lee Branner, Coral Springs; Eric George Parker, Plantation, both of FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 08/944,279

(22) Filed: Oct. 6, 1997

(51) Int. Cl.[7] ................. H04B 1/10; H04B 1/18
(52) U.S. Cl. .......... 455/212; 455/174.1; 455/223; 455/218
(58) Field of Search ............. 455/223, 222, 455/312, 154.1, 161.2, 161.1, 166.2, 174.1, 194.1, 212, 211.218, 77, 158.1, 165.1; 335/51; 327/261, 313, 262

(56) References Cited

U.S. PATENT DOCUMENTS

| | | | |
|---|---|---|---|
| 3,617,895 | * 11/1971 | Tomsa et al. | 455/166.2 |
| 3,750,032 | * 7/1973 | Andrews | 455/154.2 |
| 3,750,143 | * 7/1973 | Osborne | 341/143 |
| 3,816,762 | * 6/1974 | Holt, Jr. | 327/313 |
| 3,909,630 | * 9/1975 | Florino et al. | 327/261 |
| 3,962,644 | * 6/1976 | Baker | 455/154.1 |
| 4,287,599 | * 9/1981 | Goncharoff et al. | 455/77 |
| 4,288,753 | * 9/1981 | Babano | 330/51 |
| 4,411,021 | * 10/1983 | Yoakum | 455/222 |
| 4,731,868 | 3/1988 | Dreier . | |
| 4,947,456 | 8/1990 | Atkinson et al. . | |
| 4,991,227 | 2/1991 | Kehler, Jr. . | |
| 5,161,185 | * 11/1992 | Hochschild | 379/416 |
| 5,199,109 | * 3/1993 | Baker | 455/161.2 |
| 5,241,702 | * 8/1993 | Dent | 455/278.1 |
| 5,428,826 | 6/1995 | Masaki . | |
| 5,450,622 | * 9/1995 | Vandegraaf | 455/222 |
| 5,564,090 | * 10/1996 | Beauchamp et al. | 455/220 |
| 5,615,412 | * 3/1997 | Doran | 455/222 |

* cited by examiner

Primary Examiner—Vivian Chang
Assistant Examiner—Charles N. Appiah
(74) Attorney, Agent, or Firm—Randi L. Dulaney

(57) ABSTRACT

A technique is used by a squelch circuit (200) that generates a fast squelch. The technique involves generating a noise signal (211) from a demodulated signal (105), generating a squelch check request (405) of one of two types, performing a release (410) of a reset control (107) in response to the squelch check request, generating an integrated noise signal (106) having essentially no decay rate from the noise signal starting at the release of the reset control, generating a result of a comparison (815, 860) of the integrated noise signal to one of two values corresponding to the one of two types of squelch check requests at an expiration of a predetermined delay started at the release of the reset control, and controlling a muting (845, 870) of a speaker (128) in response to the comparison.

11 Claims, 4 Drawing Sheets

FAST SQUELCH CIRCUIT AND METHOD

FIELD OF THE INVENTION

This invention relates in general to radio receiver squelch circuits and in particular to fast acting squelch circuits used for muting received audio in a channel scanning selective call radio.

BACKGROUND OF THE INVENTION

Radio receivers that recover frequency modulated (FM) voice signals typically include a squelch circuit to mute the recovered voice signal when it is too weak or non-existent, and unmute when the recovered voice signal is likely to be intelligible. This is also described as determining whether there is channel activity. Such FM receivers typically recover an audio signal having a bandwidth greater than 10 kHz when they are activated. The recovered audio includes the recovered voice signal having a bandwidth of approximately 3 kHz. Typical squelch circuits employ a measurement of the energy of a portion of the spectrum of the recovered audio ("out of band audio") that extends from approximately 10 kHz to 30 kHz as a factor in determining whether to mute the recovered voice signal. This is based on the well known phenomenon that the energy in the 10 kHz to 30 kHz band of the receiver decreases in response to a stronger radio signal.

Many conventional voice radio receivers that are not designed for channel scanning employ continuous detection of the energy of the out of band audio, often combined with hysteresis techniques, to avoid muting a recovered audio signal during brief periods of weak signal caused by fading. The response time of such circuits are typically 100 milliseconds (msec) or more, and they work quite well.

However, when a voice radio receiver is designed for channel scanning of a plurality of voice channels, and a priority function is provided, a squelch circuit having a 100 millisecond response time is generally too long, since audio output will be interrupted and will be annoying to the listener. In a priority scanning function, the radio selects a secondary channel on which activity has been detected when no activity has been found on a priority channel, but repetitively checks the priority channel for activity. The checking causes an interruption of the recovered audio of the secondary (non-priority) channel while the recovered audio from the priority channel is being tested to determine if a valid signal is present on the priority channel. The interruption is continued after the channel is switched back to the secondary channel while the recovered audio from the secondary channel is checked to determined if a sufficiently good signal is still on the secondary channel. Thus it is particularly important in this type of scanning to have fast activity detect times. Even when a scanning receiver does not provide a priority scan function, a slow squelch response requires a slow scanning rate, which is less desirable to many customers.

One prior art technique for speeding up squelch detection is described in U.S. Pat. No. 5,128,826, issued to Masaki on Jun. 21, 1995, which is entitled "High-Speed Scanning Radio Receiver." In the technique described, channel activity is determined based on four types of signals. Two of the four types are generated from the out of band recovered audio. One of the two types is a "noise level" signal having two states (the "SC" signal), based on a detection of the energy in the out of band audio. A squelch state of the SC signal indicates that the channel has a sufficiently strong voice signal. When the SC signal is not in the squelch state, and a new channel having a sufficiently strong voice signal is selected, the SC signal eventually reaches a predetermined voltage threshold and the SC signal switches to the squelch state. However, the SC signal is "not so fast"—it can take up to 100 msec to change to the squelch state. The other signal of the two types, the "SP" signal, is also generated. It is in a first state (the active state) when the SC signal is changing towards the squelch state at a rate exceeding a predetermined rate. When a new channel is selected, if the SP signal is active within a predetermined time determined by a first timer, a second timer having a longer duration (e.g., 100 milliseconds) than the first timer is started. If the SC signal does not indicate voice activity by the expiration of the second timer, the next channel is sought (in a version of the technique described in cols. 2 and 3 of Masaki). In another version, when the described conditions occur, a state of the SP signal during the scan of the previous channel is used to determine whether the present channel has activity or a next channel should be scanned. While this technique may provide a fast determination of channel activity in many instances, it requires not only an out of band audio detector to generate the SC signal, but also a second circuit to generate the SP signal. It also sometimes waits 100 ms to make a decision, and can either miss detection of channels with activity (as asserted at the end of col. 1 and beginning of col. 2) or in the alternative (in the second version) waits 100 ms to make a determination.

Another prior art technique for speeding up squelch detection is described in U.S. Pat. No. 4,731,868 issued to Drier on Mar. 15, 1988, which is entitled "Circuitry in a Scanning Receiver for Speeding Up the Generation of a Reception or Non-Reception Criterion." In this technique, an out of band noise criterion is applied to two capacitors when the channel is switched. The capacitors are held, respectively, at a high and low voltage reference levels until the channel has switched, at which time the outputs of the capacitors change according to the amount of energy in the out of band signal, ultimately reaching the steady state value of the noise criterion (when a steady state value exists). The outputs of the capacitors are logically combined and produce two signals, only one of which can be active. One signal is an indication of valid voice activity and the other signal is an indication of noise. The time from the beginning of the measuring period until an active state of one of the two signals is reached is compared with a reference time and channel activity is determined by whether the active state is reached before that time. Although this technique may also provide a fast determination of channel activity in many instances, it is complex in that it requires two capacitor circuits when both channel activity and inactivity need to be quickly determined, and requires the measurement of non-predetermined times.

Thus, what is needed is a simpler, less costly, and reliable technique for determining the presence and absence of valid channel activity in a channel scanning selective call radio.

DETAILED DESCRIPTION OF A PREFERRED EMBODIMENT

Figure 1:
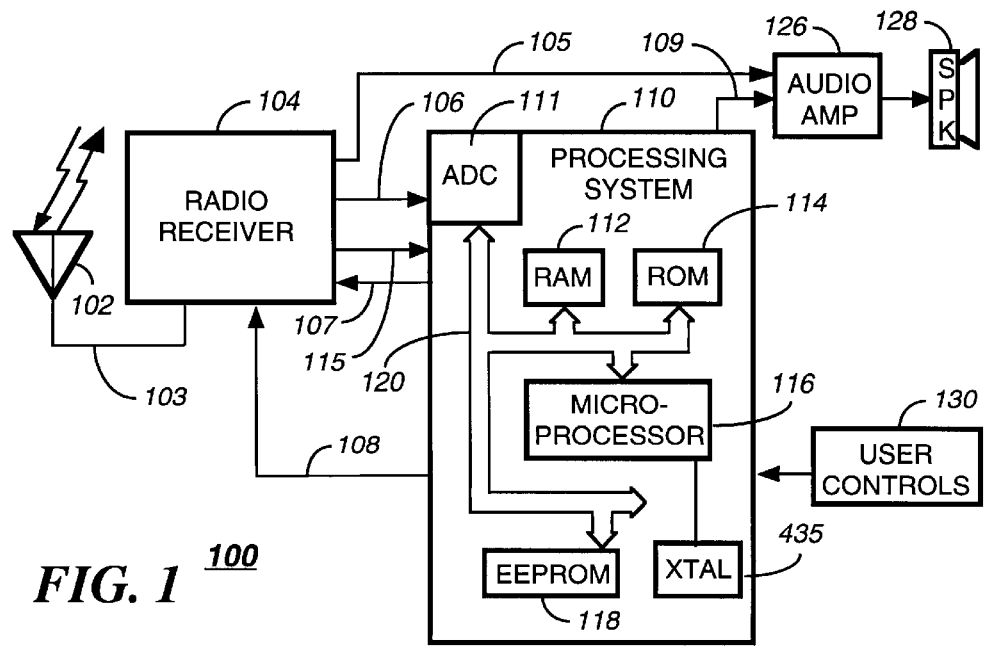
FIG. 1 shows an electrical block diagram of a multichannel selective call radio, in accordance with the preferred and alternative embodiments of the present invention.

Referring to FIG. 1, an electrical block diagram of a multichannel selective call radio 100 is shown, in accordance with the preferred embodiment of the present invention. The selective call radio 100 includes an antenna 102 for intercepting radio signals. The antenna 102 is coupled to a conventional receiver 104 wherein an intercepted signal 103, is received. Receiving includes filtering to remove undesirable energy at off channel radio frequencies, amplification of the filtered signal, frequency conversion of the intercepted signal 103, and demodulation of the converted signal in a conventional manner. The receiver 104 thereby generates a demodulated signal 105 which is coupled to an audio amplifier 126. The demodulated signal is also processed within the receiver 104 by a tone detector (not shown in FIGS. 1 or 2) which detects and decodes a tone encoded address in the demodulated signal 105 and generates from the tone encoded address a binary address signal 115 that is coupled to a processing system 110. The receiver 104 also generates an integrated noise signal 106 that is coupled to the processing system 110. The processing system 110 generates a reset control signal 107 and a channel control signal 108 that are coupled to the receiver 104. The processing system 110 is coupled to the audio amplifier 126 by a control signal 109 and is coupled to a set of user controls 130. The control signal 109 controls the audio amplifier 126, turning the speaker 128 on and off (unmuting and muting the audio). The audio amplifier 126 is coupled to a speaker 128 for presenting alerts and voice messages to a user. The processing system 110 comprises a microprocessor 116 which is coupled by a processor bus 120 to an analog to digital converter (ADC) 111, a random access memory (RAM) 112, a read only memory (ROM) 114, and an electrically erasable programmable read only memory (EEPROM) 118.

The processing system 110 compares the binary address signal 115 to a selective call address stored in the EEPROM 118, and when they match(which is described below as the "paging address" "being present" or "having been received") the demodulated signal 105 is further processed according to modes set by manipulation of the set of user controls 130, in a manner that is conventional except for the operation of channel activity detection. For example, the set of user controls includes a channel control for selecting a priority channel operational mode of the selective call radio 100.

When the selective call address of the selective call radio 100 has been matched in a decoded tone address and the demodulated signal 105 is determined in a unique manner by the processing system 110 to be sufficiently noise free, the audio is unmuted, and the audio amplifier 126 then amplifies the demodulated signal 105 in a conventional manner. The processing system 110 uses the integrated noise signal 106 to make the decision to mute or unmute the speaker, as will be described in more detail below.

The RAM 112, the EEPROM 118, the ADC 111 are preferably conventional parts. The ROM 114 is a conventional part programmed with masked program instructions. Preferably, the microprocessor 116 is similar to a M38022M4 manufactured by Mitsubishi Semiconductor America Inc. of Durham, N.C. It will be appreciated that other similar microprocessors can be utilized for the microprocessor 116, and that additional processors of the same or alternate type can be added as required to handle the processing requirements of the processing system 110. It will be appreciated that other types of memory, e.g., ultraviolet erasable programmable read only memory (UVEPROM) or flash ROM, can be alternatively utilized for the ROM 114, as well as the RAM 112. It will be further appreciated that the RAM 112, the EEPROM 118, the ADC 111, and the ROM 114, singly or in combination, can be integrated as a contiguous portion of the microprocessor 116.

The processing system 110 performs functions which are conventional, including, for example, channel control and generating alert tones, and other functions described below with reference to FIGS. 2–5, which are unique. The conventional and unique functions are executed by the microprocessor 116 under control of segments of program codes stored in the ROM 114. The unique functions are controlled by unique segments of program codes generated using conventional programming tools and techniques.

It will be appreciated that the processing system can be alternatively implemented without the microprocessor 116, by implementing the conventional and unique functions described herein with a combination of conventionally available off the shelf integrated circuits such as CMOS shift registers, clocks, gates, counters, DAC, ADC; and RAM, and that further, some or all of the conventionally available off the shelf integrated circuits used to implement the processing system can be alternatively implemented in an application specific integrated circuit. It will be further appreciated that the microprocessor 116 can alternatively be a conventional microprocessor, such as a processor in the family of MC68HC11 microprocessors manufactured by Motorola, Inc., of Schaumburg, Ill. Although a digital signal processor could alternatively be used, such use would typically raise the cost of the selective call radio 100 and is therefore not preferable.

Figure 2:
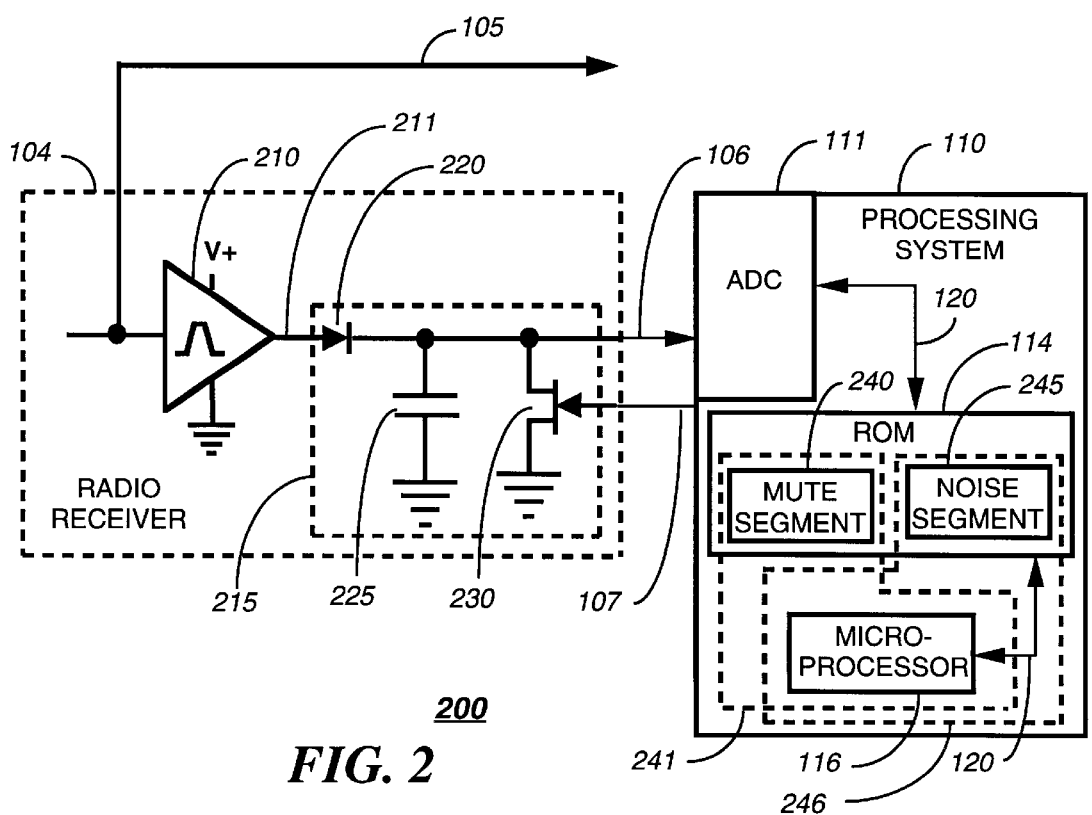
FIG. 2 shows an electrical block diagram of a squelch circuit used in the multichannel selective call radio, in accordance with the preferred embodiment of the present invention.

Referring to FIG. 2, an electrical block diagram of a squelch circuit 200 used in the selective call radio 100 is shown, in accordance with the preferred embodiment of the present invention. The squelch circuit 200 comprises portions of the receiver 104 and the processing system 110. The squelch circuit 200 comprises a bandpass amplifier 210 and a resettable noise integrator 215 of the receiver 104. The demodulated signal 105 is coupled to the bandpass amplifier 210 which filters the demodulated signal 105, rejecting portions of the signal below a low frequency cutoff of approximately 10 kHz and above a high frequency cutoff of approximately 30 kHz, and amplifies the portion of the signal with energy in the frequency range from approximately 10 kHz to 30 kHz, generating a noise signal 211. The bandpass amplifier 210 is coupled to a ground and a positive voltage, V+, supplied by a power source not shown in FIGS. 1 and 2, such as a battery of the selective call radio 100, or a regulated voltage derived from the battery. The noise signal 211 is coupled to the resettable noise integrator 215, which comprises a diode 220, a capacitor 225, and a reset switch 230. The diode 220 and capacitor 225 are series coupled between the output of the bandpass amplifier 210 and the ground, forming an integrator having a time constant determined essentially by the output impedance of the bandpass amplifier 210 and the capacitance of the capacitor 225, with an output signal at the series junction of the diode 220 and capacitor 225 which is the integrated noise signal 106. The reset switch 230, which is a conventional field effect transistor, is coupled between the series junction of the diode 220 and capacitor 225, and ground, and is controlled by the reset control 107 generated by the processing system 110.

When the reset control 107 is asserted, that is to say it is in a reset state, the reset switch 230 essentially grounds the integrated noise signal 106, and when the reset control 107 is unasserted, or in a release state, the integrated noise signal 106 increases from the time when the reset control 107 is unasserted at a rate determined by the amount of energy in the noise signal 211 towards a maximum voltage $V_D$ that is equal or nearly equal to V+, although it may alternatively be a different, predetermined value, such as a regulated voltage. It will be appreciated that there is essentially no conductance in parallel with the capacitor when the reset control 107 is unasserted, so that the integrated noise signal has essentially no decay rate. Therefore the integrated noise signal 106 is not a detected noise signal representing the instant amount of energy in the noise signal 211, as commonly found in other prior art squelch circuits. An example of a prior art detected noise signal is described in U.S. Pat. No. 5,428,826 issued on Jun. 27, 1995 to Masaki, entitled "High-Speed Scanning Radio Receiver" at col. 6, lines 7–9 ("the detected noise level . . . from . . . node 42"). The integrated noise signal 106 also differs from a type of integrated noise criteria ("potentials 5 and 9") described in U.S. Pat. No. 4,731,868 issued to Drier on Mar. 15, 1988, which is entitled "Circuitry in a Scanning Receiver for Speeding Up the Generation of a Reception or Non-Reception Criterion." At col. 4, lines 42–44 of Drier, "the rate of change of potentials 5 and 9 and the final state of the charging and discharging governed by potential 1 of the noise criterion." The foregoing description from Drier essentially requires that the circuit being described includes a decay rate, since the final states are determined by the potential of the noise criterion, and the function thus differs from the integrated noise signal 106 described in accordance with the present invention, which has essentially no decay rate.

The integrated noise signal 106 is coupled to the ADC 111, wherein it is sampled at an expiration of the predetermined delay, 10 msec, after the reset control 107 is released and converted to a digital value that is coupled to the microprocessor 116. The squelch circuit comprises the ADC 111, a noise level section 246, and a mute section 241 of the processing system 110. The ROM 114 comprises two unique sets of program instructions named a noise segment 245 and a mute segment 240. The noise level section 246 comprises the microprocessor 116 and the noise segment 245. The functions of the noise level section 246 are provided by the microprocessor 116 operating in accordance with the program instructions in the noise segment 245 as well as conventional program segments elsewhere within the ROM 114. The noise level section 246 releases the reset control 107 and makes a comparison of the integrated noise signal 106 to one of two values corresponding to one of two types of squelch check requests at the end of a 10 msec predetermined delay started at the release of the reset control 107. The mute section 241 comprises the microprocessor 116 the mute segment 240. The functions of the mute section 241 are provided by the microprocessor 116 operating in accordance with the program instructions in the mute segment 240 as well as conventional program segments elsewhere within the ROM 114. The mute section 241 generates the squelch check request and controls muting of the speaker 128 in response to results of the comparison of the integrated noise signal 106 made by the noise level section 246.

Figure 3:
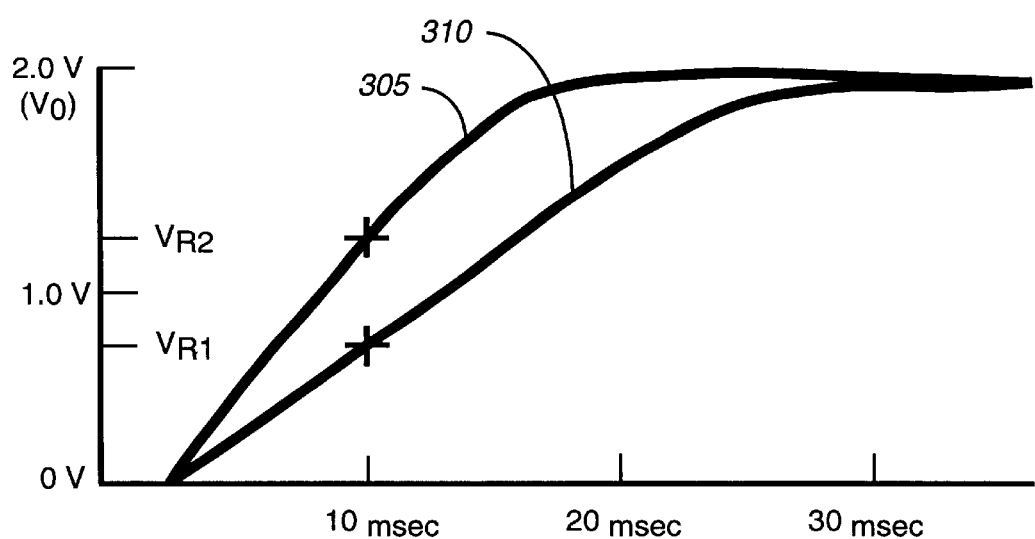
FIG. 3 shows a graph of an integrated noise signal generated in the squelch circuit, in accordance with the preferred embodiment of the present invention.

Referring to FIG. 3, a graph 300 of the integrated noise signal 106 is shown, in accordance with the preferred embodiment of the present invention. When the demodulated signal 105 has a noise measurement of 4 dB SINAD, the voltage of integrated noise signal 106 increases as shown in curve 305, and when the demodulated signal 105 has a SINAD noise measurement of 10 dB, the voltage of integrated noise signal 106 increases as shown in curve 310. (SINAD indicates that the measurement is a signal plus noise and distortion to noise and distortion measurement made by the well known standard SINAD method) The voltage of integrated noise signal 106 starts at zero Volts and asymptotically approaches the maximum voltage $V_D$ described above with reference to FIG. 3. At a time 10 msec after the release of the reset control 107, the voltage of the 10 dB curve 310 is at a first squelch voltage of $V_{R1}$ and the voltage of the 4 dB curve is at a second squelch voltage of $V_{R2}$. When the demodulated signal 105 is a voice signal and the noise measurement is less than 4 dB the voice will be generally be unintelligible and listening to the signal would be irritating. When the demodulated signal 105 is a voice signal and the noise measurement is greater than 10 dB the voice will be generally be intelligible. Thus, a demodulated signal 105 for which the voltage of the integrated noise signal 106 is less than or equal to $V_{R1}$ 10 msec after release of the reset control 107 can be classified as a low noise signals (or a "good signal") and a demodulated signal 105 for which the voltage of the integrated noise signal 106 is greater than $V_{R1}$ 10 msec after release of the reset control 107 can be classified as a "not good signal". Analogously, a demodulated signal 105 for which the voltage of the integrated noise signal 106 is greater than or equal to $V_{R2}$ 10 msec after release of the reset control 107 can be classified as a high noise signal (or a "poor signal") and a demodulated signal 105 for which the voltage of the integrated noise signal 106 is less than $V_{R2}$ 10 msec after release of the reset control 107 can be classified as a "not poor signal".

Figure 4:
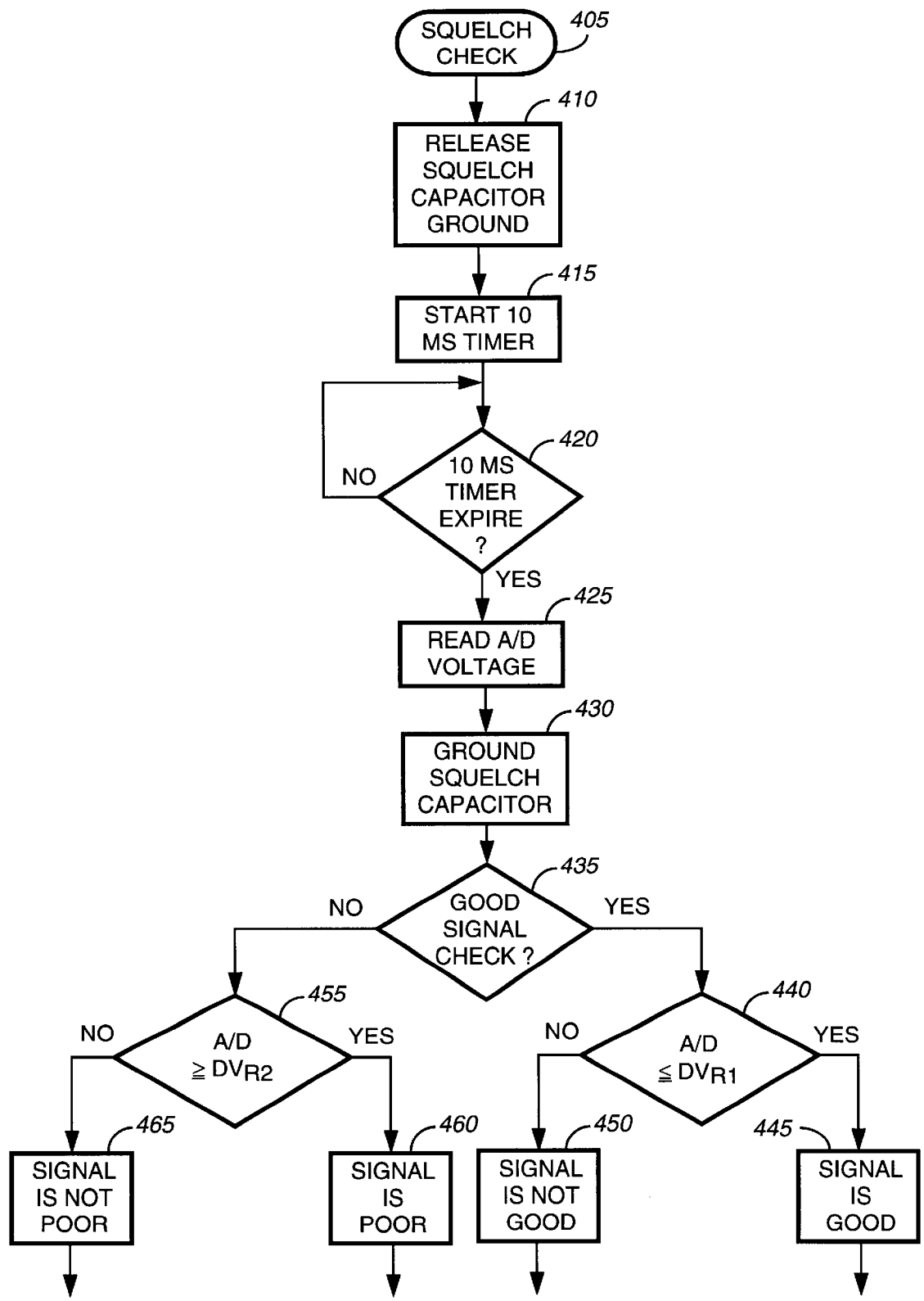
FIG. 4 shows a flow chart of a squelch check performed by the squelch circuit, in accordance with the preferred embodiment of the present invention.

Referring to FIG. 4, a flow chart of a squelch check performed by the noise level section 246 of the squelch circuit 200 is shown, in accordance with the preferred embodiment of the present invention. At step 405, a squelch check request of one of two types (a good signal type or a bad signal type) is generated within the processing system 110 by the mute section 241. In response to the squelch check request at step 410, the noise level section 246 changes the reset control 107, which has been in the reset (or asserted) state, to the release state, and the noise level section 246 starts a 10 msec timer at step 415. When the 10 msec timer expires at step 420, the noise level section 246 reads the digitized value of the integrated noise signal 106 from the ADC 111 at step 425. The noise level section 246 then asserts the reset control 107 at step 430, effectively grounding the capacitor 225 until the next squelch check is performed. The type of squelch check is determined to be either a good signal or bad signal type at step 435 by the noise level section 246. When the squelch check is determined to be a good signal type at step 435, the digitized value of the integrated noise signal 106 is compared to a digital value, $DV_{R1}$, that represents $V_{R1}$ by the noise level section 246 at step 440. When the digitized value is less than or equal to $DV_{R1}$, the result of the comparison at step 445 is that the demodulated signal 105 is a good signal. When the digitized value is greater than or equal to $DV_{R1}$, a result of the comparison is that the demodulated signal 105 is not a good signal at step 450. When the squelch check is determined to be a poor signal type at step 435, the digitized value of the integrated noise signal 106 is compared to a digital value, $DV_{R2}$, that represents $V_{R2}$ by the noise level section 246 at step 455, and when the digitized value is greater than $DV_{R2}$, a result of the comparison at step 460 is that the demodulated signal 105 is a poor signal. When the digitized value is less than $DV_{R2}$ at step 455, the result of the comparison is that the demodulated signal 105 is not a poor signal at step 465.

Figure 5:
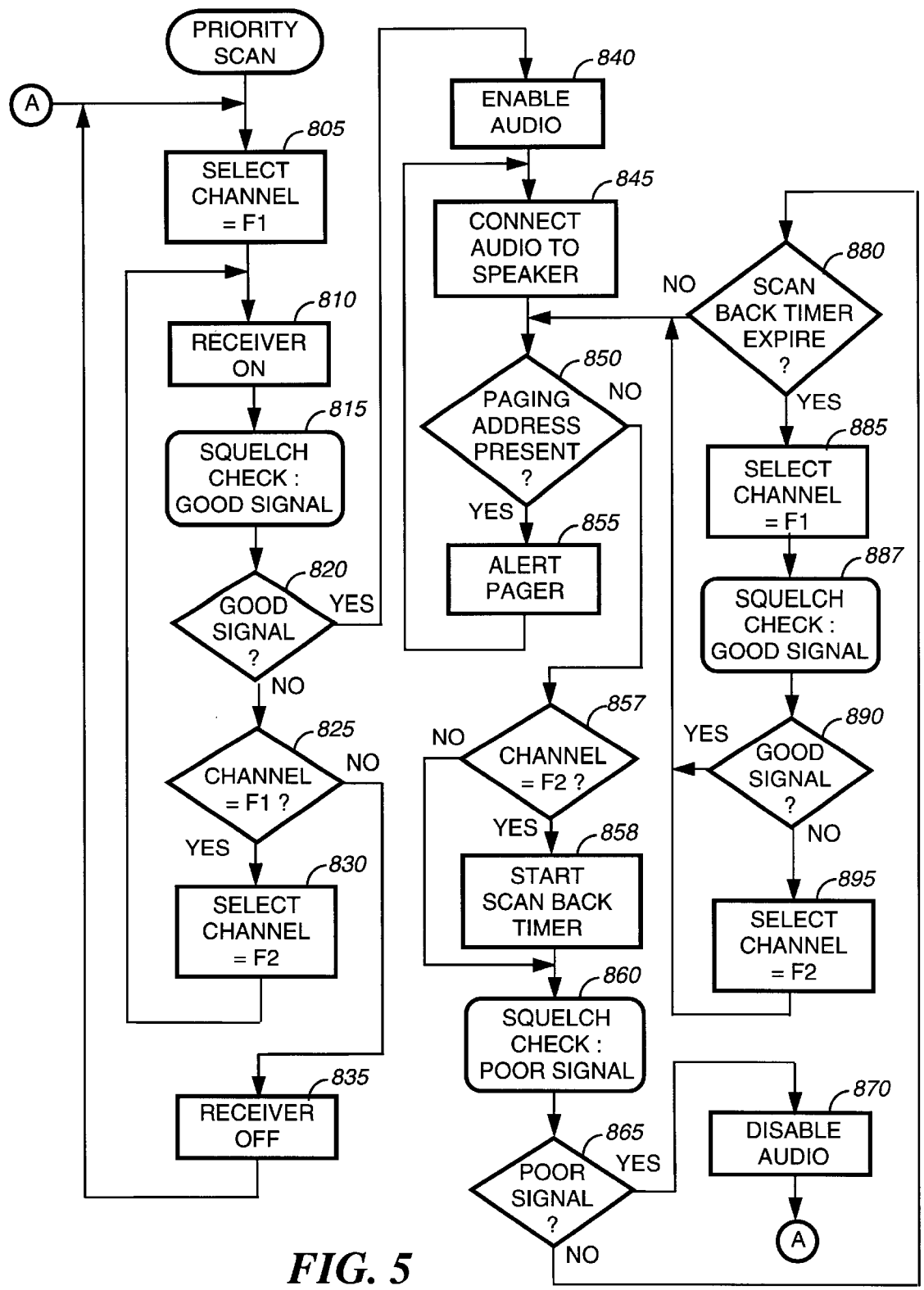
FIG. 5 shows a flow chart of the muting of the selective call radio performed by the squelch circuit when the selective call radio is operating in a priority scan mode, in accordance with the preferred embodiment of the present invention.

Referring to FIG. 5, a flow chart of the muting of the selective call radio 100 performed by the mute section 241 of the squelch circuit operating in a priority scanning mode is shown, in accordance with the preferred embodiment of the present invention. At step 805 the mute section 241 generates the channel control signal 108 in a conventional manner, for tuning the receiver 104 to receive on a first channel (F1) which in this example is a priority channel. Then the mute section 241 turns on the receiver 104 at step 810, which takes approximately 30 msec. The mute section 241 next makes a request for a squelch check of the good signal type at step 815, which is performed as described above with reference to FIG. 4, taking approximately 10 msec. When the result of the squelch check is determined to not be a good signal at step 820 the mute section 241 makes a determination at step 825 whether the selected channel is F1, and when it is F1, the mute section 241 selects a second channel (F2) at step 830, which in this example is a non-priority channel, and repeats step 810 (turning on the receiver 104) and the steps which logically follow, as described above. When the selected channel is determined not to be F1 at step 825, the mute section 241 turns off the receiver 104 at step 835 for approximately 500 msec and then repeats step 805 (select F1) and the steps logically following, as described above, after the 500 msec receiver delay expires.

At step 820 when the result of the squelch check is determined to be a good signal, the mute section 241 enables the demodulated signal 105 at step 840 by a control signal (not shown in FIGS. 1 or 2) coupled to the receiver 104, then effectively connects the demodulated signal 105 to the speaker 128 at step 845 by use of the control signal 109 that is coupled to a multiplexer (not shown in FIGS. 1 or 2) that is a portion of the audio amplifier 126. The mute section 241 then determines whether the paging address has been received at step 850 (as described above with reference to FIG. 1). When the paging address has been received (is present) at step 850, the mute section 241 changes the control signal 109, effectively disconnecting the demodulated signal 105 from the speaker 128, and generates an audible alert tone that is coupled to the audio amplifier 126 and made audible by the speaker 128 at step 855. When the paging address is not present at step 850 (i.e., none has been received since the last alert tone was generated), the mute section 241 determines whether the selected channel is F2 at step 857, and when it is not F2, a squelch check of the poor signal type is performed at step 860, as described above with reference to FIG. 4. When the result is not a poor signal at step 865, a determination is made whether the scan back timer is expired at step 880. Note that when channel F2 has not been selected for some time, the scan back timer is not enabled, and therefore does not expire. When the scan back timer is not expired at step 880, the mute section again determines whether the paging address is present at step 850. Thus, once a good signal is found on channel F1 at step 820 and the scan back timer has not been enabled, the audio (from the F1 channel) remains unmuted and steps 850, 857, 860, and 880 are processed in a fast loop by the mute section 241. Under these circumstances, each time the pager address is received at step 850, an alert tone is generated, until, at step 865 the result is a poor signal, in which event the mute section 241 disables the audio at step 870 and repeats step 805 (select F1) and the steps which logically follow it, as described herein.

When, at step 820 the result is a good signal, and when the selected channel is F2 as a result of step 835, and when the paging address is not present at step 850, then at step 857 the mute section determines that F2 is selected at step 857 and the scan back timer is started when it is not already started (alternatively described as being enabled) at step 858. The scan back timer has a software programmable duration of ½, 1 or 2 seconds, although other selectable durations could be provided. The mute section 241 then requests a squelch check of the poor signal type at step 860. When the result of the squelch check is determined not to be a poor signal at step 865, the mute section 241 determines whether the scan back timer has expired at step 880 and, when it has not expired, the mute section 241 repeats step 850 (determining whether the paging address is present) and the steps that logically follow, as described above, thus monitoring F2 by repeatedly executing steps 850, 857,858, 860, 865 and 880, and generating an alert tone at step 855 whenever the paging address is received on F2, until the mute section 241 determines that the scan back timer has expired at step 880.

Under these circumstances of monitoring F2, when the mute section 241 determines that the scan back timer has expired at step 880, it changes the channel control signal 108 to select F1 at step 885 and requests a squelch check of the good signal type at step 887. When the result of the squelch check is a good signal at step 890, the channel selection remains at F1 until the result of the squelch check performed at step 860 is a poor signal at step 865, as described above. However, when the result of the squelch check at step 890 is not a good signal, the mute section 241 changes the channel back to F2 at step 895 and the process continues at step 850. The receiver 104 remains on while the channel is switched to F1 at step 885 the squelch check of the good signal type is performed at step 887, and the channel is switched back to F2 at step 895

When F2 is determine to be selected at step 857 and the result of the squelch check is determined to be a poor signal at step 865, the mute section 241 disables the audio at step 870 and repeats step 805 (select channel F1) and the steps which logically follow, as described above. In this event, the scanning starts over again, seeking a good signal first on F1, then on F2, then shutting down for 500 msec for battery saving purpose when a good signal is not found on both F1 and F2.

When F2 has been selected and scan back to F1 is being performed as described above, the audio of F2 is interrupted for two receiver switchover times (to F1 and back to F2), and for two durations of the squelch check on F1. Although the power to the receiver 104 is kept on during this time, the switchover times are approximately 30 msec each, so with a 10 msec squelch detect time the total "hole" in the F2 audio is approximately 80 msec. It will be appreciated that the minimum squelch delay of 10 msec in accordance with the preferred embodiment of the present invention is highly desirable in these circumstances to keep the squelch delay time at a minimum, as compared to some prior art circuits which require up to 100 msec for a squelch check, and which therefore would introduce a "hole" in the audio of approximately 260 msec when the prior art circuit is used in a comparable radio under the same circumstances.

It will be appreciated that some of the circuits described herein can be eliminated and their functions be performed instead by the processing system 110, when appropriate program instructions are added to the ROM 114 and when the microprocessor 116 operates fast enough. For example, the integration performed by the resettable noise integrator 215 and the filtering of the bandpass amplifier 210 could be performed in the processing system 110. It will be appreciated that the architecture described herein in accordance with the preferred embodiment of the present invention provides the band filtering of the demodulated signal 105 and the integration of the noise signal 211 using very few components. By using a single capacitor for the resettable noise integrator, the microprocessor 116 is relieved of having to perform the function of integrating the noise signal 211, which allows the use of a more cost effective microprocessor and less program instruction memory, or in the alternative allows the microprocessor to perform other functions.

It will be appreciated that the squelch circuit 200 described herein provides a fast determination of the noise quality of the demodulated signal 105 and requires only a single resettable noise integrator 215 and only a single comparison of the integrated noise signal 106 to a reference value (one of $DV_{R1}$ and $DV_{R2}$) whenever a determination is made to mute or unmute. By using a fixed time for determining the value of the integrated noise value, the squelch circuit is simplified in comparison to prior art circuits in which a time at which a signal reaches a value must determined.

We claim:

1. A squelch circuit, comprising:
   a bandpass amplifier coupled to a demodulated signal, that generates a noise signal from the demodulated signal;
   a resettable noise integrator coupled to the bandpass amplifier, wherein the resettable noise integrator has essentially no decay rate and generates an integrated noise signal from the noise signal when a release of a reset control is performed, and wherein the integrated noise signal increases starting when the reset control is released towards a squelch voltage at a rate determined by an amount of energy in the noise signal;
   a memory coupled to the resettable noise integrator, for pre-storing a digitized first squelch voltage and a digitized second squelch voltage;
   a noise level section coupled to the memory that,
      in response to a good signal squelch check request, releases the reset control and generates a result of a comparison of a digitized integrated noise signal to the digitized first squelch voltage at an expiration of a predetermined delay started at the release of the reset control; and
      in response to a poor signal squelch check request, releases the reset control and generates a result of a comparison of the digitized integrated noise signal to the digitized second squelch voltage at an expiration of a predetermined delay started at the release of the reset control; and
   a mute section coupled to the noise level section and the demodulated signal that generates the squelch check request and controls muting of a speaker in response to the result.

2. The squelch circuit according to claim 1, wherein the resettable noise integrator comprises a diode, a capacitor, and a transistor switch.

3. The squelch circuit according to claim 1, wherein the bandpass amplifier has a low frequency cutoff at approximately 10 kiloHertz and a high frequency cutoff at approximately 30 kiloHertz.

4. The squelch circuit according to claim 1, wherein the noise level section comprises a microprocessor, an analog to digital converter, and a noise segment of stored program instructions.

5. The squelch circuit according to claim 1, wherein in response to a good signal squelch check request, one of a "good signal" and "not good signal" result is determined, and in response to a poor signal squelch check request, one of a "poor signal" and "not poor signal" result is determined.

6. The squelch circuit according to claim 1, wherein the mute section comprises a microprocessor and a mute segment of stored program instructions.

7. The squelch circuit according to claim 1, wherein the predetermined delay is approximately 10 milliseconds.

8. A selective call radio that comprises the squelch circuit according to claim 1.

9. The selective call radio according to claim 8, wherein when the selective call radio is operated in a scanning mode, a squelch check of a first of the two types is requested by the mute section when no channel has been selected, and wherein a squelch check of a second of the two types is requested by the mute section when a channel has been selected.

10. A method for performing a squelch check in a selective call radio, comprising the steps of:
    generating a noise signal from a demodulated signal;
    generating a squelch check request of one of two types;
    performing a release of a reset control in response to the squelch check request;
    generating an integrated noise signal having essentially no decay rate from the noise signal starting at the release of the reset control, wherein the integrated noise signal increases starting at the release of the reset control towards a maximum voltage at a rate determined by an amount of energy in the noise signal;
    generating a result of a comparison of the integrated noise signal to one of two values corresponding to the one of two types of squelch check request at an expiration of a predetermined delay started at the release of the reset control; and
    controlling a muting of a speaker in response to the result.

11. The method according to claim 10, wherein in the step of generating a result of a comparison, when the squelch check request is of a first type, a voltage of the integrated noise signal is compared to a first squelch voltage and one of a "good signal" and "not good signal" result is determined, and when the squelch check request is of a second type, the voltage of the integrated noise signal is compared to a second squelch voltage and one of a "poor signal" and a "not poor signal" result is determined.

* * * * *